United States Patent
Vinciarelli

[19]

[11] Patent Number: 6,107,860
[45] Date of Patent: Aug. 22, 2000

[54] HIGH EFFICIENCY FLOATING GATE DRIVER CIRCUIT USING LEAKAGE-INDUCTANCE TRANSFORMER

[75] Inventor: Patrizio Vinciarelli, Boston, Mass.

[73] Assignee: VLT Corporation, San Antonio, Tex.

[*] Notice: This patent issued on a continued prosecution application filed under 37 CFR 1.53(d), and is subject to the twenty year patent term provisions of 35 U.S.C. 154(a)(2).

[21] Appl. No.: 07/805,474

[22] Filed: Dec. 11, 1991

[51] Int. Cl.$^7$ ............................................. H03K 17/687
[52] U.S. Cl. ..................... 327/427; 327/304; 327/109; 327/434
[58] Field of Search ..................... 307/571, 572, 307/246, 263, 582, 270, 300

[56] References Cited

U.S. PATENT DOCUMENTS

| | | | |
|---|---|---|---|
| 4,415,959 | 11/1983 | Vinciarelli | 363/21 |
| 4,461,966 | 7/1984 | Hebenstreit | 307/571 |
| 4,748,351 | 5/1988 | Barzegar | 307/572 |
| 4,777,387 | 10/1988 | Collins | 307/570 |
| 4,897,580 | 1/1990 | Schultz | 315/408 |
| 4,967,109 | 10/1990 | Steigerwald | 307/571 |
| 4,970,420 | 11/1990 | Billings | 307/571 |
| 5,010,261 | 4/1991 | Steigerwald | 307/571 |
| 5,019,719 | 5/1991 | King | 307/571 |

FOREIGN PATENT DOCUMENTS

| | | | |
|---|---|---|---|
| 46-24451 | 7/1971 | Japan . | |
| 58-136137 | 8/1983 | Japan . | |
| 60-49377 | 11/1985 | Japan . | |
| 0035616 | 2/1986 | Japan | 307/571 |
| 61-35616 | 2/1986 | Japan . | |
| 63-139421 | 6/1988 | Japan . | |
| 0300617 | 12/1989 | Japan | 307/571 |
| 2-2704 | 1/1990 | Japan . | |
| 2-50616 | 2/1990 | Japan . | |
| 3-32282 | 2/1991 | Japan . | |

OTHER PUBLICATIONS

Tabisz et al., "0–Voltage Switched Quasi–Resonant Buck and Flyback Converters", IEEE Transactions on Power Electronics, p. 194, Apr. 1989.
International Rectifier Preliminary Data Sheet No. PD–6.017, "High Voltage Current Limiting MOS Gate Driver".
International Rectifier Application Note AN–978A, 1990, "HV Floating MOS–Gate Driver IC".
Product brochure, 1990, pp. 38–44.

Primary Examiner—Toan Tran
Attorney, Agent, or Firm—Fish & Richardson P.C.

[57] ABSTRACT

A gate driver for turning on and turning off a power switching device having a capacitive gate control input provides galvanic isolation between low-level control circuitry and the power switching device by means of a transformer having a controlled amount of effective secondary leakage inductance. The secondary of the transformer is connected in series with the gate control input and a first unidirectional conducting device. Driver logic on the secondary side of the transformer controls a gate switch which is connected across the gate control input. The gate driver operates in a multiplexed mode: if a voltage pulse is applied across the primary winding of the transformer at a time when the power switching device is off the driver logic will turn the gate switch off, thereby enabling charging of the effective gate capacitance as a means of turning the power switching device on; if a voltage pulse is applied across the primary winding of the transformer at a time when the power switching device is on the driver logic will turn the gate switch on, thereby discharging the effective gate capacitance as a means of turning the power switching device off. Both the turn-on and the turn-off voltage pulses are of the same polarity. During a turn-on pulse, energy is transferred between the voltage source connected across the primary winding and the effective gate capacitance via the effective secondary leakage inductance of the transformer.

39 Claims, 9 Drawing Sheets

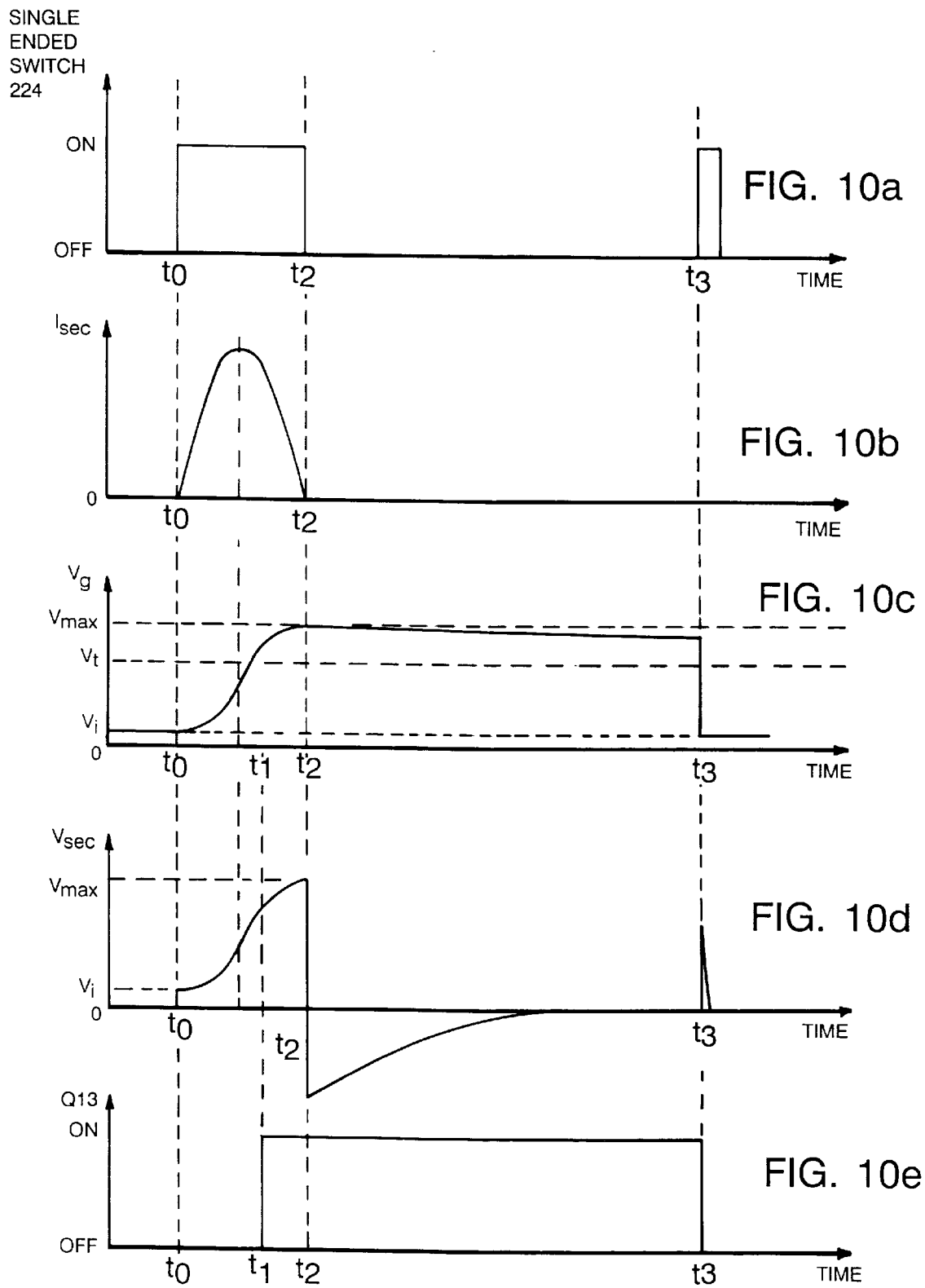

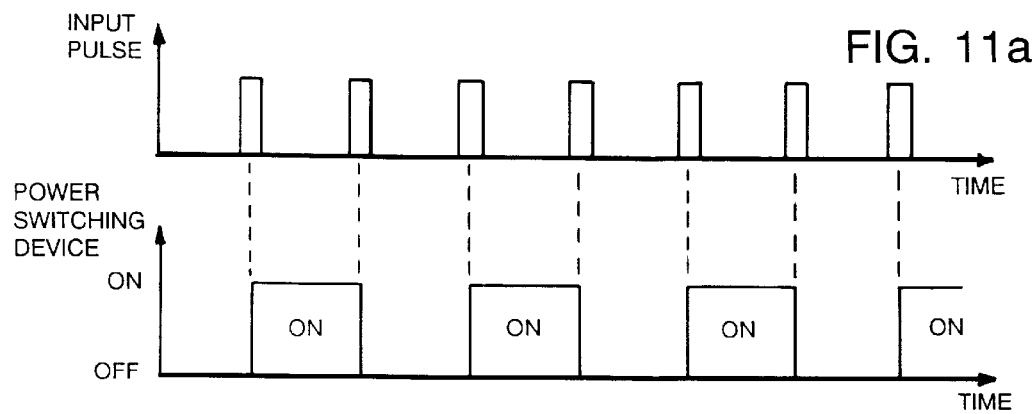
FIG. 11a
FIG. 11b
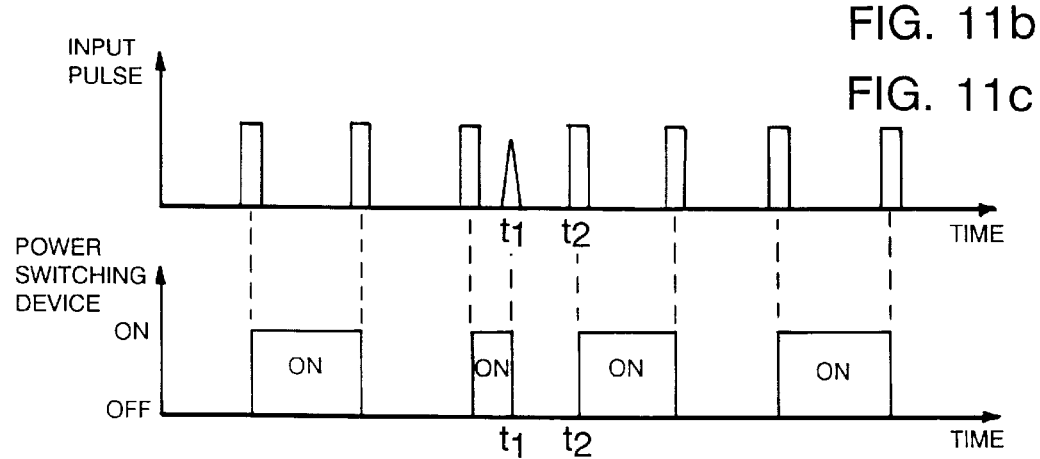
FIG. 11c
FIG. 11d
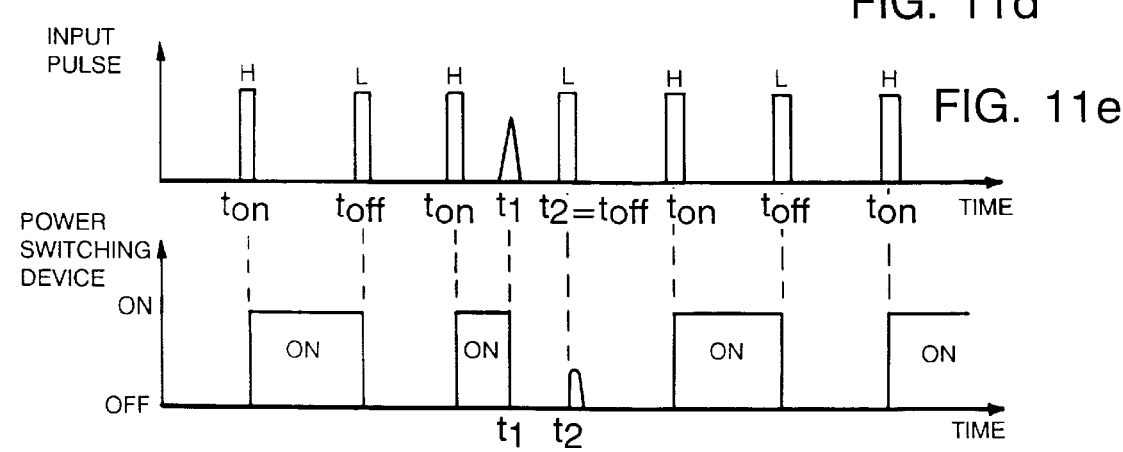
FIG. 11e
FIG. 11f

HIGH EFFICIENCY FLOATING GATE DRIVER CIRCUIT USING LEAKAGE-INDUCTANCE TRANSFORMER

BACKGROUND OF THE INVENTION

This invention relates to conductivity control of capacitive input power switching devices.

Power switching devices having a capacitive gate control input (e.g., MOSFET, insulated gate bipolar transistor (IGBT), MOS-controlled thyristor (MCT)) are used in a multitude of electronic switching applications (e.g., on/off load controls, switching amplifiers, motor drivers, DC—DC converters, cycloconverters). Such devices are turned on by charging the gate capacitance to some appropriate, relatively low, voltage value (e.g., 8 or 15 volts) and are turned off by discharging the gate capacitance (e.g., to a voltage near zero volts). Information as to when the power switching device is to be on and off is typically generated by low-level electronic control circuitry. This information is delivered to a gate driver circuit which is designed to rapidly charge and discharge the gate capacitance of the power switching device as a means of turning the device on and off. The capacitive characteristic of the gate terminal implies that turn-on and turn-off speed of the power switching device will be dependent, in large part, upon the ability of the gate driver to source and sink current into and out of the gate capacitance.

One conventional way to turn such a power switching device on and off is by means of a pair of gate switches (FIG. 1). A first gate switch 12 is connected in series with a source of gate bias voltage 16 and the gate terminals of the power switching device 10; a second gate switch 14 is connected across the gate terminals. Turning the first switch on (by means of the control circuitry 18), with the second switch off, charges the gate capacitance 20 to a voltage essentially equal to that of the bias voltage source; turning the second switch on (with the first switch off) discharges the gate capacitance to essentially zero volts. In a conventional gate driver circuit 22 of this kind the total energy dissipated in the gate driver circuit during each switching cycle (i.e., turn-on/turn-off cycle) will be equal to twice the peak energy stored in the gate capacitance 20 during the cycle: half of this energy is lost in the first gate switch 12 during charging, the other half is lost in the second gate switch 14 during discharge. As the switching frequency (i.e., the rate at which switching cycles occur) increases, the amount of power dissipated in the gate driver will increase proportionately. This can be particularly troublesome in high-frequency power switching applications.

Steigerwald (U.S. Pat. No. 4,967,109, Oct. 30, 1990) shows how to improve upon the performance of a conventional gate driver by placing a diode and inductor in series with the first gate switch (FIG. 2). When the first gate switch 22 is turned on (with the second gate switch 24 off) the inductor 32 resonates with the gate capacitance 30 and the gate voltage "rings up" to a voltage equal to twice the bias source 26 voltage. The diode 34 prevents reverse energy flow back from the gate capacitance to the inductor. The gate capacitance is discharged by turning the second gate switch 24 on (with the first gate switch off). There are several benefits to this quasi-resonant gate driver 36 approach: (a) by using a quasi-resonant energy transfer mechanism, the loss in the first gate switch is essentially eliminated, yet a fast transition in the rise of gate voltage can be achieved by appropriate selection of the inductor value (i.e., by setting the equivalent characteristic time constant of the LC circuit formed by the gate capacitance 30 and the inductor 32 to a suitably small value) and, (b) the value of the bias voltage source needed to achieve some desired value of gate turn-on voltage can be reduced by one half. In U.S. Pat. No. 5,010,261, Apr. 23, 1991, Steigerwald discloses a more complex gate drive circuit which provides quasi-resonant transitions at both turn-on and turn-off, further reducing losses in the driver. A related approach, using a single switch across the gate of the power switching device and an inductor and diode in series with the gate and a bias voltage source, is described by Tabisz, Gradzki, et al., in "Zero-Voltage Switched Quasi-Resonant Buck and Flyback Converters—Experimental Results at 10 MHz," IEEE Transactions on Power Electronics, April 1989, p. 194. In the Tabisz circuit quasi-resonant ring-up of the gate voltage to a value more than twice the value of the bias voltage source is achieved by use of a "flyback" approach in a constant frequency power converter.

The conventional and quasi-resonant gate driver circuits 22, 36 described above are examples of circuits in which the gate driver, the control circuitry and the gate terminals of the power switching device are all referenced to a common signal return. There are many applications, however, in which the gate terminals of the power switching device are referenced to a circuit node which "floats" at a voltage value different from that of the control circuitry signal return. For example, in FIG. 3, the gate voltage, Vg, of the "high side" power switching device 40 is referenced to a circuit node 42 which might vary by hundreds of volts as the power switching device turns on and off. One way to drive the gate of a floating power switching device is to use a non-isolated active level-shifting gate driver circuit. One such circuit, manufactured as a monolithic integrated circuit, part No. IR2125, by International Rectifier, California, U.S., is described in Preliminary Data Sheet No. PD-6.017, "High Voltage Current Limiting MOS Gate Driver". Other active level-shifting circuits are described in International Rectifier Application Note AN-978A, 1990. Such circuits have a number of drawbacks: (a) they are lossier and more complex than conventional non-floating drivers; (b) the active level-shifting devices used in such circuits (e.g., semiconductor devices) must withstand the voltage difference between the floating node and the control circuitry signal return, and these devices may fail catastrophically if this voltage is allowed, even momentarily, to exceed the device's breakdown voltage rating; (c) the lack of galvanic isolation between the control circuitry and the floating gate increases circuit sensitivity to the effects of noise and rate-of-change of the floating voltage, and (d) they require a floating source of gate bias voltage (e.g., a floating bias supply, a "bootstrap" circuit, a charge pump).

Another way of implementing a floating gate driver is to incorporate an isolation transformer in the gate driver circuit. One such gate driver circuit is disclosed in Barzegar, U.S. Pat. No. 4,748,351, "Power MOSFET Gate Driver Circuit", May 31, 1988 (and shown schematically in FIG. 4). In the Figure, the transformer isolated gate driver 50 includes a conventional pulse isolation transformer 52 with a primary winding 54 referenced to control circuit return and a pair of secondary windings 56, 58 referenced to the floating gate terminal node 60. A differential driver 62 connected to the primary winding allows changing the polarity of the voltage pulses delivered by the secondary windings. One secondary winding 56 is connected in series with a first diode 64 and the gate terminals of the power switching device 66; the other secondary winding 58 is connected in series with a second diode 68 and the gate control terminals of a gate switch 70 which is wired across the gate terminals of the power switching device 66. When the primary is driven by a pulse of a first polarity, the gate capacitance 72 of the power switching device is charged to a voltage determined by the voltage output of the differential driver and the turns ratio of the isolation transformer 52; when the primary is driven by a pulse of the opposite polarity, the gate switch 70 turns on and the gate capacitance of the power switching device is discharged. The transformer isolated gate driver 50 of FIG. 4 improves upon active level-shifting in terms of reduced complexity, improved breakdown voltage capability, improved noise immunity and elimination of the need for a floating bias source. Other transformer isolated driver configurations are illustrated in the previously referenced International Rectifier application note. From a loss viewpoint, however, none of the referenced transformer-isolated circuits are an improvement over a conventional gate driver circuit.

Galvanically isolated gate driver circuits using optical couplers are also described in the prior art. However, such circuits generally require a floating source of bias voltage and exhibit propagation delays which are typically longer than those found in electrically coupled circuits.

In U.S. Pat. No. 4,415,959, Vinciarelli teaches how energy may be losslessly transferred from an input voltage source to a capacitor via a controlled amount of leakage inductance in an isolation transformer. In Vinciarelli's forward power converter circuit a switch couples a voltage source to the primary of a transformer having a controlled amount of leakage inductance. The secondary winding of the transformer is connected in series with a capacitor and a diode. The switch is closed at zero current; current rises and falls essentially sinusoidally in the transformer windings as a quantum of energy is passed from the input source to the capacitor via the transformer leakage inductance; and the switch is opened at zero current. During this energy transfer phase, and assuming ideal components, the capacitor will charge to a voltage essentially equal to twice the reflected source voltage (the reflected source voltage being equal to the input source voltage multiplied by the coupling coefficient of the tranformer and divided by the transformer primary to secondary turns ratio). The diode in series with the secondary prevents any of the energy stored in the capacitor from returning back to the source.

SUMMARY OF THE INVENTION

In general, in one aspect, the invention features a gate driver apparatus for charging and discharging a capacitive gate control input of a power switching device, the gate control input having an effective capacitance. In the apparatus, a transformer having primary and secondary windings is constructed to have a controlled amount of effective leakage inductance. A first switching device is connected in series with the primary winding. Control circuitry selectively closes and opens the first switching device to connect a voltage source across the primary winding. A first unidirectional conducting device is connected in series with the secondary winding, the first unidirectional conducting device being oriented to conduct during conduction by the first switching device. Ports couple the gate driver apparatus to the gate control input of the power switching device. There is discharge circuitry for discharging the effective capacitance. Driver logic enables quantized forward energy transfer from the voltage source to the ports to charge the effective capacitance of the gate control input, and operates the discharge circuitry to discharge the effective capacitance.

Preferred embodiments of the invention include the following features. The discharge circuitry includes a second switching device connected in series with the first unidirectional conducting device and the secondary winding and between the ports. The driver logic includes sensing circuitry for determining the on or off state of the power switching device and the open or closed state of the first switching device, and driver circuitry for enabling the quantized forward energy transfer and for operating the discharge circuitry, in response to the on or off state of the power switching device and the open or closed state of the first switching device. The sensing circuitry includes a first sense input connected to detect conductivity information indicative of whether the power switching device is turned on or turned off, and a second sense input connected to detect first-switch state information indicative of whether said first switching device is opened or closed. The driver circuitry, in response to a closure of the first switching device at a time when the power switching device is off, causes the second switching device to open, thereby enabling quantized forward energy transfer from the source to the effective capacitance of the gate control input as a means of turning the power switching device on, and, in response to a closure of the first switching device at a time when the power switching device is on, causes the second switching device to close, thereby discharging the effective capacitance and turning the power switching device off. In some embodiments, the control circuitry is arranged to open the first switching device at essentially the first instant in time following initiation of a quantized forward energy transfer cycle at which the current in the secondary winding returns to zero. In other embodiments, the first switching device is opened at a point in time later than the time which is first instant in time following initiation of a quantized forward energy transfer cycle at which the current in the secondary winding returns to zero. In other embodiments, the control circuitry is arranged to open the first switching device after a predetermined time period following initiation of a quantized forward energy transfer cycle. In the latter case, the predetermined period of time is selected to be greater than or equal to the maximum anticipated time span between closure of the first switch and the subsequent instant in time at which the current in the secondary winding returns to zero.

The sensed conductivity information may be an electrical signal indicative of the voltage across the gate control input, or indicative of the current carried by the power switching device. The first switch state information comprises an electrical signal indicative of the voltage across the secondary winding.

The driver logic is arranged to turn the second switching device on when the conductivity information is below a predetermined first threshold value and the first switching device is open. In some embodiments, the conductivity information comprises the voltage across the gate control input and the first threshold value is essentially equal to 8 volts.

The apparatus may also include means for controlling the effects of transformer magnetizing current, for example, a snubber circuit including a second unidirectional conducting device in series with a resistor, the snubber circuit being connected in parallel with the secondary winding, the second unidirectional conducting device being poled so that the second unidirectional conducting device is nonconducting when the first unidirectional conducting device is conducting current. The first unidirectional conducting device, the second switch, the driver logic, and the snubber circuit may be a single monolithic integrated circuit.

The apparatus may also include a lumped inductance connected in series with the primary winding, or in series with the secondary winding, or in parallel with the capacitive control input.

The first switching device and the control circuitry may be arranged to selectively alter the amount of charge which can be delivered to circuitry connected to the secondary winding during a charge transfer cycle beginning with the closing of the first switching device and ending with the opening of the first switching device. For example, the amount of charge transferred during the charge transfer cycle may be below a first predetermined value if the charge transfer cycle is intended to cause the power switching device to turn off. The driver logic is arranged so that if the power switching device is turned off at the beginning of the charge transfer cycle, and the amount of charge transferred during the charge transfer cycle is below the first predetermined value, then, at essentially the time at which the charge transfer cycle ends, the driver logic will cause the second switching device to close. Selective alteration of the amount of charge transferred during a charge transfer cycle is effected by altering the amount of time that the first switching device is closed. The first switching device may be a low-resistance switch in parallel with a high-resistance switch, and wherein selective alteration of the amount of charge transferred during a charge transfer cycle is effected by closing and opening one or the other of the switches.

Upon opening the first switching device at the end of the quantized forward energy transfer cycle, the value of the voltage across the effective capacitance is greater than the reflected source voltage established by the voltage source and the transformer.

The transformer, the first switching device, the control circuitry, the first unidirectional conducting device, the second switching device, the driver logic and the magnetizing current control means comprise a single composite device having five terminals: a first terminal for delivering electrical information to the control circuitry, the electrical information being indicative of whether the power switching device is to be turned on or turned off; a second terminal for connection to one end of the voltage source; a third terminal for connection to the signal return of the low-level electrical information and to the other end of the voltage source; and fourth and fifth terminals for connection to the gate control input of the power switching device; the control circuitry is embodied as a monolithic integrated circuit.

The control circuitry and the first switching device are embodied as a single monolithic integrated circuit. The driver logic, the first unidirectional conducting device, the second switching device and the magnetizing current control means are embodied as a single monolithic integrated circuit. The composite device may comprise a hybrid construction.

In general, in another aspect, the invention features integrated drive power switching apparatus in which, for example, there are three terminals: a first terminal for connecting the integrated drive power switching apparatus to one end of the secondary winding; a second terminal for connecting the integrated drive power switching apparatus to the other end of the secondary winding, the second terminal also being connected to a first current-carrying termination of the power switching device; and a third terminal connected to a second current carrying termination of the power switching device. The integrated drive power switching apparatus may be embodied as a monolithic integrated circuit on a single die, or there may a first monolithic integrated circuit comprising the first unidirectional conducting device, the second switching device, the magnetizing current control means; and the driver logic; and a power semiconductor die embodying the power switching device. The first monolithic integrated circuit and the semiconductor die may be combined into a single package by means of hybrid construction and interconnection techniques.

In one mode of operation, a succession of unidirectional voltage pulses are delivered to the primary winding of the transformer, each consecutive one of the unidirectional pulses causing the power switching device to alternately turn on and turn off.

In general, in another aspect, the invention features a method for avoiding loss of pulse-by-pulse synchronization in a gate driver apparatus. The method includes selectively altering the amount of charge transferred to circuitry connected to the transformer secondary winding during the period that the first switching device is closed depending on whether closure of the first switch is intended to turn the power switching device on or off, and discharging the effective gate capacitance of the power switching device if the charge delivered to the effective capacitance during the time period during which the first switching device is closed is below a predetermined threshold value.

Other advantages and features will become apparent from the following description and from the claims.

DESCRIPTION

We first briefly describe the drawings:

FIGS. 10A–10E show operating waveforms for the gate driver circuit of FIG. 9.

FIGS. 11A through 11F show how the on and off states of a power switching device are synchronized to a train of input pulses in various gate driver circuit embodiments.

DESCRIPTION OF THE PREFERRED EMBODIMENT(S)

Figure 5:
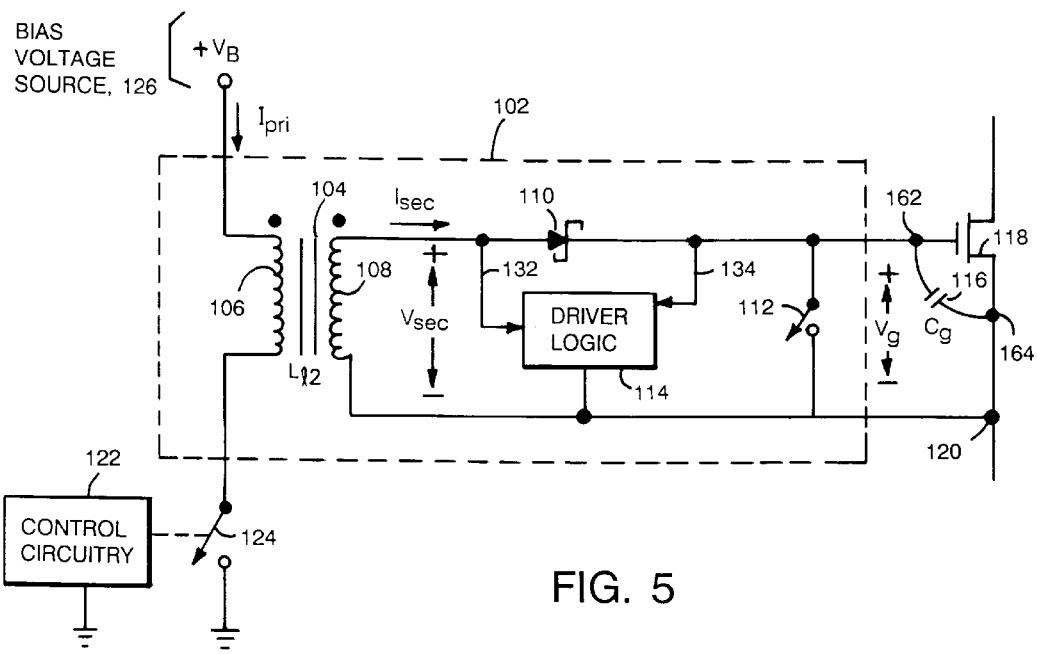
FIG. 5 shows a gate driver circuit according to the present invention.

A gate driver circuit 102 according to the present invention is shown schematically in FIG. 5. In the Figure, the gate driver circuit 102 comprises a leakage inductance transformer 104, having a primary winding 106 containing N1 turns, a secondary winding 108 containing N2 turns, and characterized by a mutual inductance of value M henries, a coupling coefficient of value k, a total primary inductance of L1 henries, and a total secondary inductance of value L2 henries; a first diode 110; a gate switch 112; and driver logic 114 for controlling whether the gate switch 112 is on or off. In the Figure, the output of the gate driver circuit 102 is connected to the gate control input terminals 162, 164 of a power switching device 118 of the kind which has a capacitive gate control input (e.g., a MOSFET, IGBT, MCT). For clarity, the gate capacitance of the power switching device is shown as a lumped capacitor 116. The input of the gate driver circuit is connected to a bias voltage source 126 and a single-ended switch 124. The single-ended switch is turned on and off by control circuitry 122. The gate terminals 162, 164 of the power switching device are referenced to a circuit node 120 which may be "floating" at a voltage value different from that of the control circuitry 122 and bias source 126 signal return.

In its various embodiments, the gate driver circuit 102 of FIG. 5 operates in a "multiplexed" mode. An appropriately timed voltage pulse applied across the primary winding 106 of the transformer 104 (e.g., by means of closing and opening the single-ended switch 124) will turn the power switching device 118 on; the power switching device will remain on until another voltage pulse is applied across the primary winding, at which time it will turn off. Both pulses are of the same polarity. Both the transformer secondary voltage, Vsec, and the gate voltage of the power switching device, Vg, are delivered to the driver logic 114 via the secondary sense input 132 and the gate sense input 134, respectively. The driver logic 114 determines when the gate switch 112 is to be turned on (to discharge the gate capacitance 116 and turn the power switching device off) and turned off (to allow charging of the gate capacitance as a means of turning the power switching device on).

In preferred embodiments, the transformer 104 in the gate driver circuit 102 of FIG. 5 is designed to provide a controlled amount of leakage inductance (i.e., it is a leakage-inductance transformer). To illustrate the operation of such a gate driver circuit 102 we assume ideal circuit elements and initially assume that both the gate switch 112 and the power switching device 118 are off (i.e., the gate capacitance 116 is discharged and the gate voltage, Vg, is essentially zero). At time t=t0, the control circuitry 122 closes the single-ended switch 124 (FIG. 6A), thereby impressing the voltage delivered by the bias voltage source 126, Vb, across the primary winding 106 of the leakage inductance transformer. In accordance with the principles disclosed by Vinciarelli (U.S. Pat. No. 4,415,959, "Forward Converter Switching at Zero Current", incorporated herein by reference), the current in both the primary 106 and the secondary 108 windings of the leakage inductance transformer 104, Ipri and Isec, respectively (FIGS. 6C and 6B), will be zero at time t=t0 and will rise and fall sinusoidally between t=t0 and t=t1 as energy is transferred from the bias voltage source to the gate capacitance 116 via the leakage inductance of the transformer 104 and the series diode 110. During this quantized forward energy transfer phase the voltage across the gate capacitance 116, Vg (FIG. 6D), will rise sinusoidally to a value closely approximated by Vmax= 2·Vb·(M/L1)=2·Vb·(k/a)=2·Vref, where a=N1/N2 is the turns ratio of the transformer 104 and Vref=Vb·(k/a) is defined as the reflected source voltage established by the transformer and the bias voltage source. At time t=t1, the current Isec returns to zero and the control circuitry 122 opens the single-ended switch. This technique, whereby energy is unidirectionally transferred from a voltage source to a capacitor via a series diode and the effective leakage inductance of a transformer, causing the capacitor voltage to ring up to a peak value, will be generally referred to herein as "quantized forward energy transfer."

Figure 6:
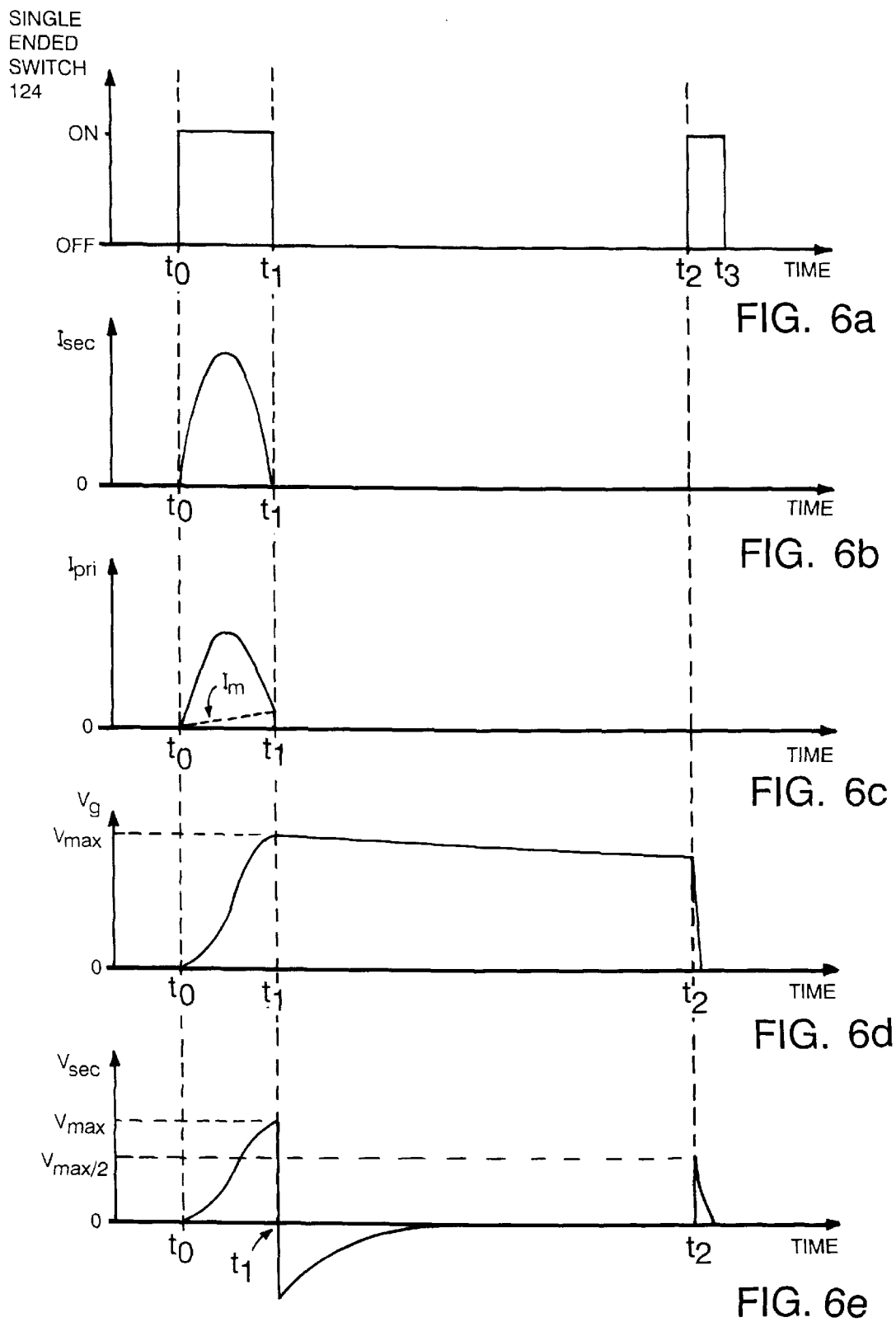
FIGS. 6A–6E show operating waveforms for the gate driver circuit of FIG. 5.
Figure 7:
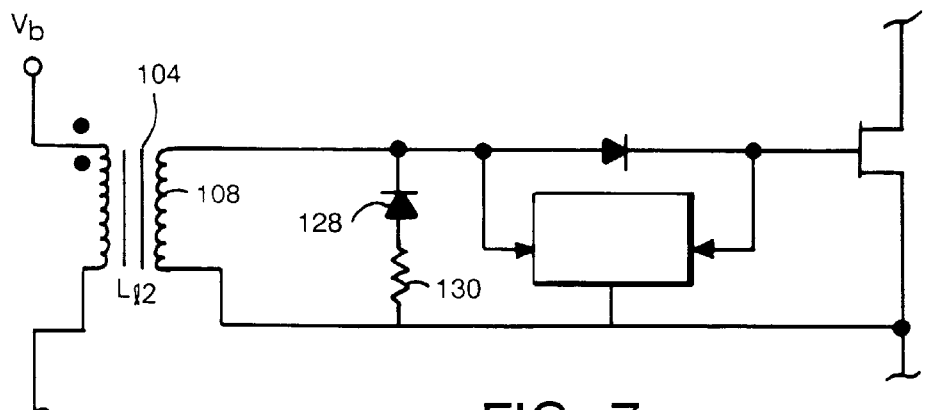
FIG. 7 shows one embodiment of a snubber circuit for use with the gate driver circuit of FIG. 5.

Between t=t0 and t=t1 magnetizing current will build up in the primary winding (as indicated by the dashed line, marked Im, in FIG. 6C, and the resulting nonzero value of Ipri at t=t1). The effects of this magnetizing current can be controlled by any of a wide variety of prior art techniques. For example, a "snubber" circuit, comprising a resistor 130 and a second diode 128, could be connected across the secondary winding 108 of the leakage-inductance transformer 104, as shown in FIG. 7. When the single-ended switch 124 opens, the magnetizing current will commutate into the secondary winding and the snubber circuit will control the peak negative excursion (FIG. 6E) of the secondary voltage as it dissipates the magnetizing energy as heat.

Just after time t=t1, the gate capacitance will be charged to Vmax, the first diode 110 will be reverse biased, preventing the gate capacitance from discharging back through the transformer secondary, and the power switching device 118 will be turned on. The gate voltage, Vg, is delivered to the driver logic 114, via the gate sense connection 134, serving as both a bias voltage source for operating the driver logic during the time period t=t1 to t=t2, and as a signal input indicative of the value of Vg.

At time t2 the control circuitry once again causes the single-ended switch to close. Since the gate capacitance is charged to a voltage approximately equal to 2·Vb·(k/a), the first diode will remain reverse biased as the secondary voltage rises to a value approximately equal to Vb·(k/a)=Vmax/2 (FIG. 6E). The driver logic 114, sensing the rise in secondary voltage (via the secondary sense input 132) at a time when the power switching device is on (which it senses via the value of Vg at the gate sense input 134), turns the gate switch 112 on, discharging the gate capacitance (FIG. 6D) and turning the power switching device off. The single-ended switch is turned off at time t=t3, after which the gate driver is once again in the operating state which existed at time t=t0.

The rise time of the gate voltage (e.g., the time span, t=t0 to t=t1, over which the gate voltage rises from zero volts to a peak value Vmax) will be a function of the effective value of the gate capacitance 116, Cg, and of the value of the effective secondary leakage inductance of the transformer. For a transformer with equally coupled windings, a coupling coefficient of value k, a total secondary inductance (i.e., the inductance of the secondary winding measured with the primary winding open-circuit) of value Ls, and negligible winding resistance, the effective secondary leakage inductance will be Ll2=2·Ls·(1−k). The rise time for a circuit having secondary leakage inductance of value Ll2 and an effective gate capacitance of value Cg will be Tr=pi·sqrt (2·Ls·Cg·(1−k)). For example, a gate driver circuit which includes an equally coupled leakage inductance transformer having a coupling coefficient k=0.97 and a secondary inductance of 4.5 microhenries, driving a power switching device having an effective gate capacitance equal to 3000 picofarads, will exhibit a rise time of Tr=89 nanoseconds.

Figure 1:
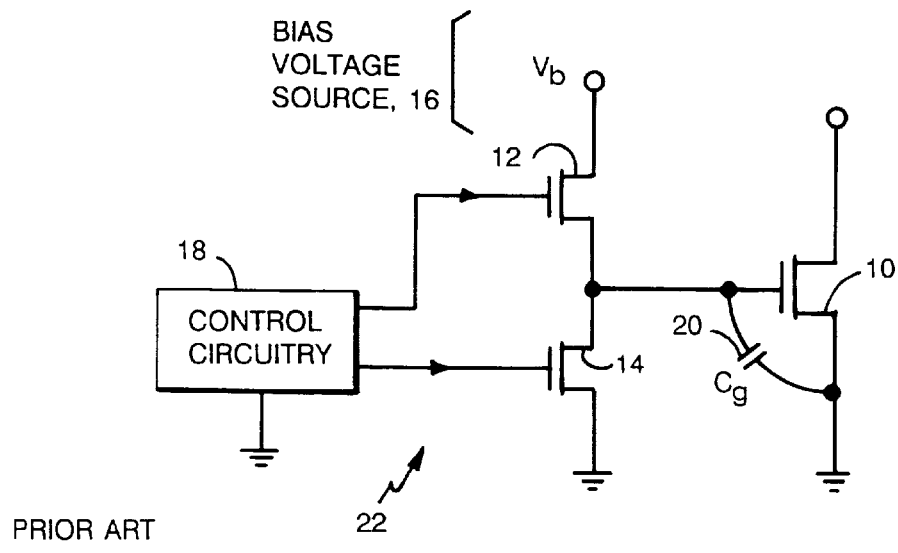
FIGS. 1 and 2 show examples of prior art nonisolated gate driver circuits.
Figure 2:
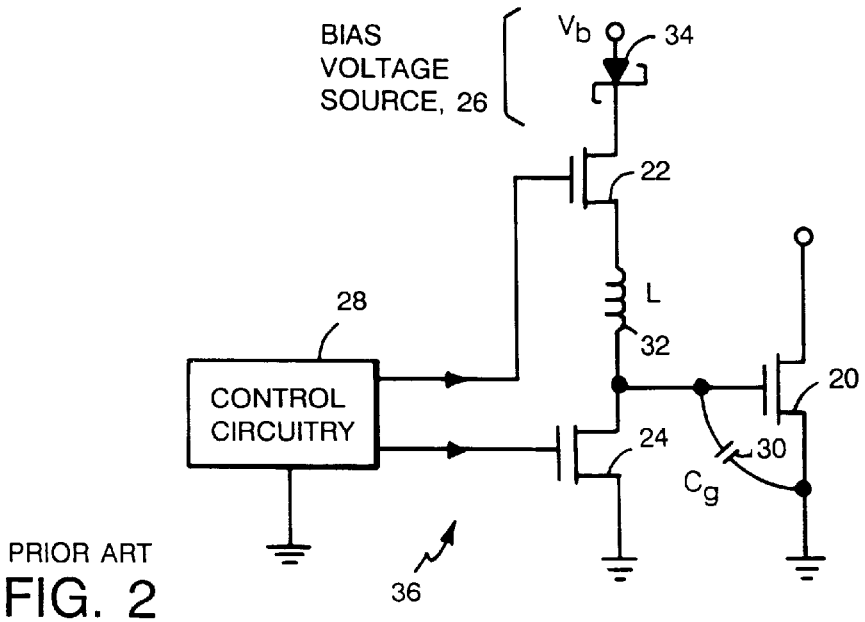
Figure 3:
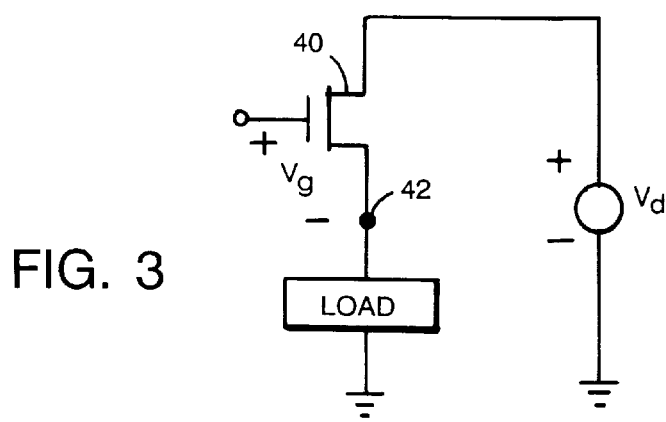
FIG. 3 shows a high-side switching circuit wherein the voltage across the gate terminals of the power switching device must float above the load voltage.
Figure 4:
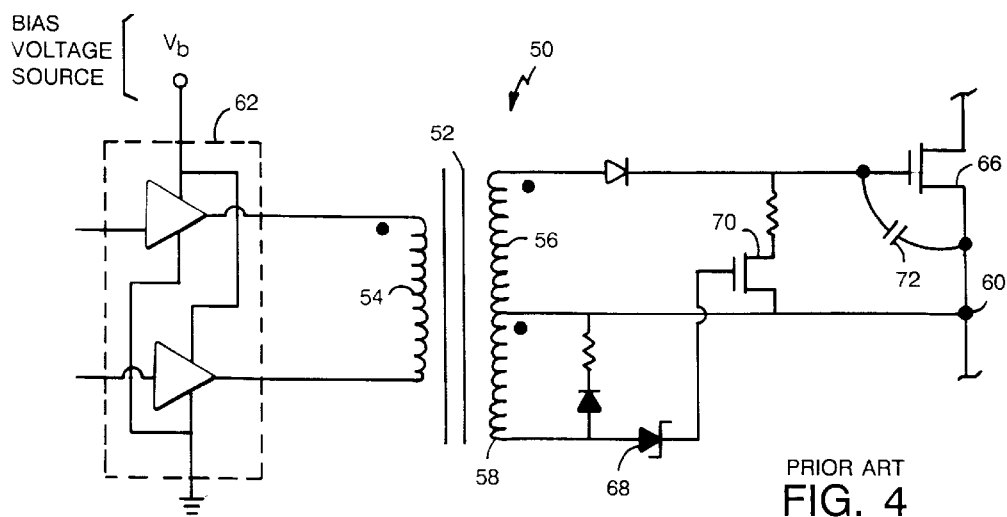
FIG. 4 shows a prior art transformer-isolated gate driver circuit.

The gate driver circuit 102 of FIG. 5 exhibits the following combination of benefits: (a) it offers the benefits of galvanic isolation: floating drive capability, high breakdown voltage rating and high noise immunity, (b) it requires no floating bias source, (c) by using a quantized forward energy transfer mechanism it provides double the effective gate drive voltage compared to that which could otherwise be realized in a conventional transformer isolated gate driver circuit without a floating bias source (e.g., as in FIG. 4), and (d) by using a quantized forward energy transfer mechanism, losses in the gate driver associated with charging the gate capacitance are greatly reduced.

Figure 9A:
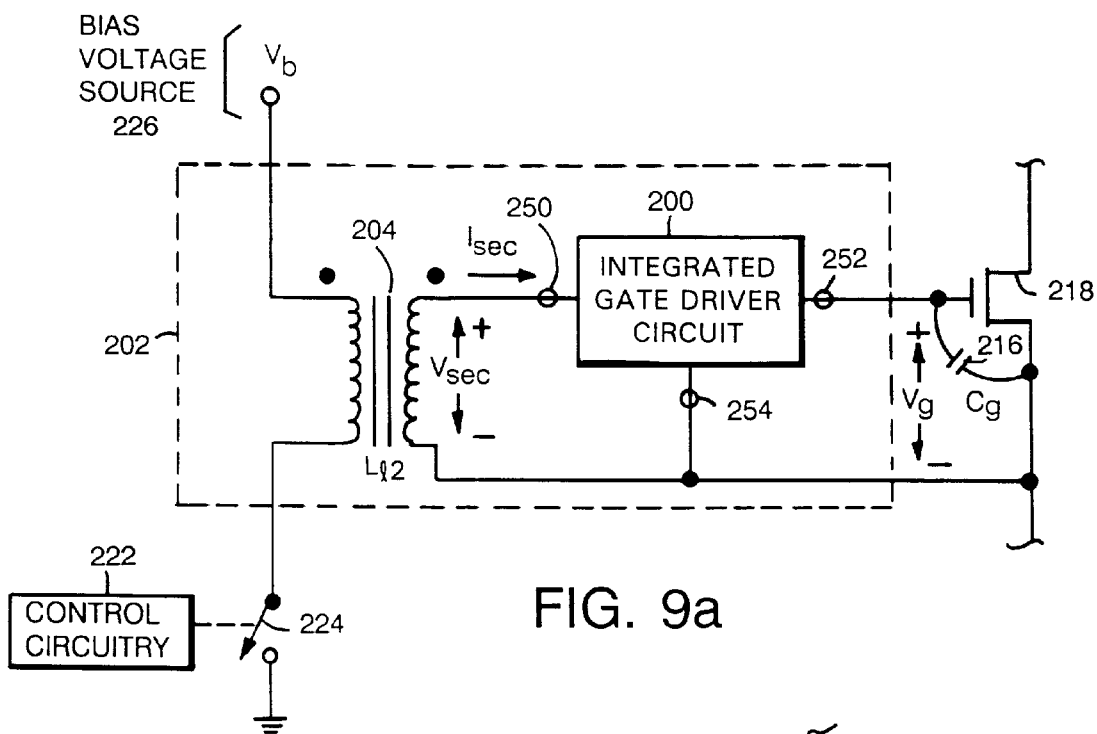
FIGS. 9A and 9B show, respectively, a gate driver circuit which includes the circuit shown in FIG. 8, and a portion of a gate driver circuit which includes certain parasitic circuit inductances.
Figure 9B:
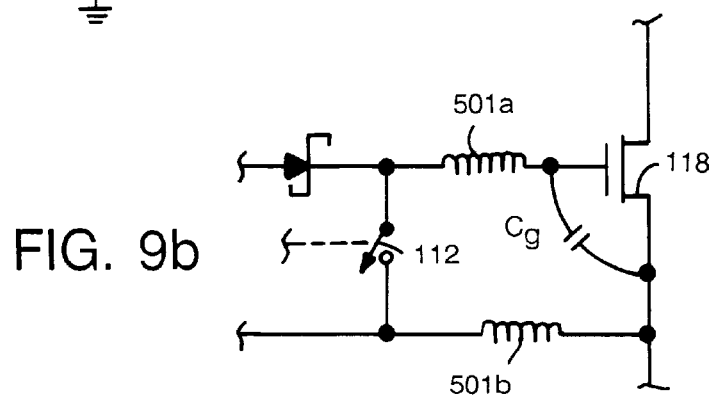
Figure 8:
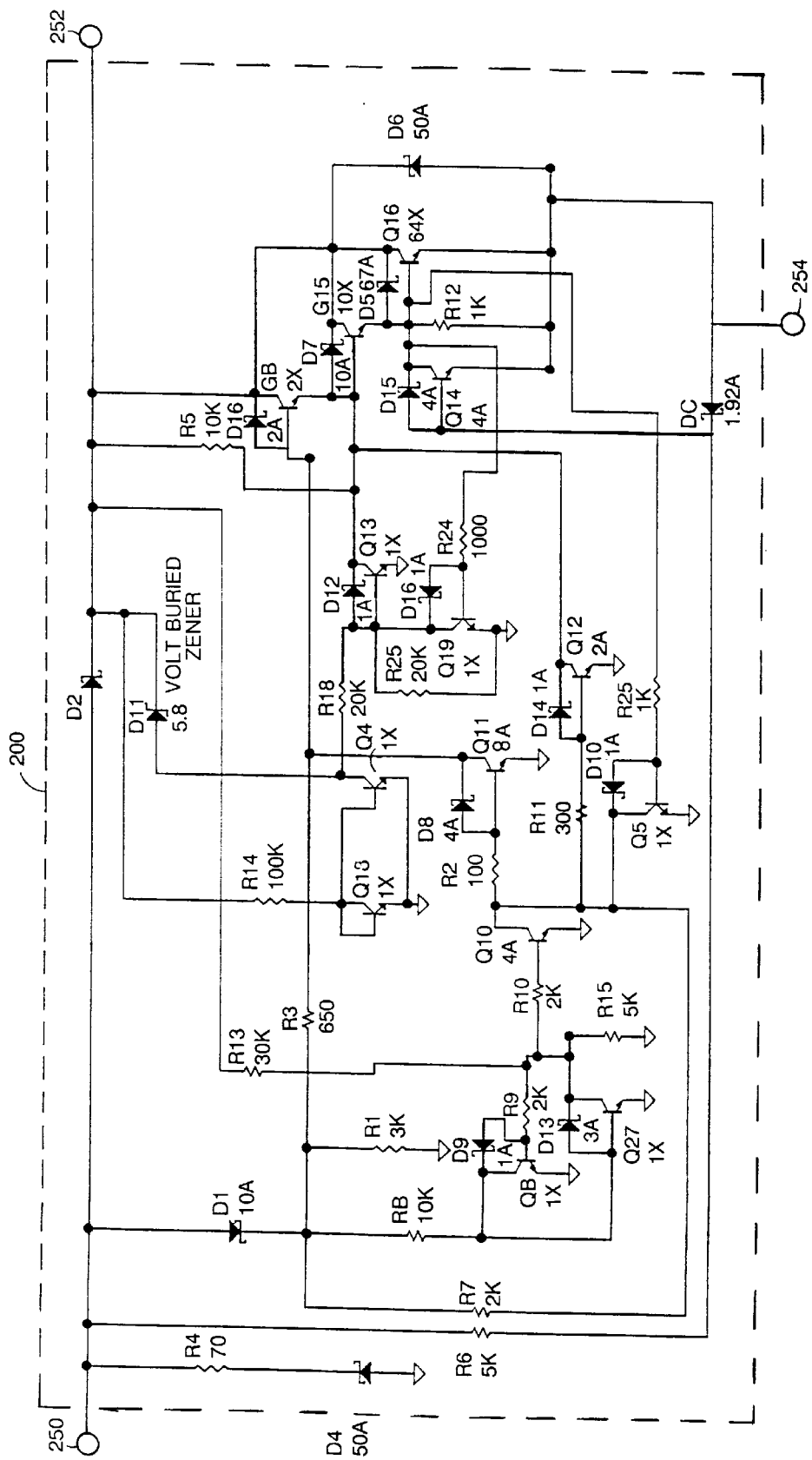
FIG. 8 shows a circuit schematic of a preferred embodiment of a circuit for use in a gate driver according to the present invention.

There are many ways of implementing the driver logic 114 of FIG. 5. In one actual implementation, which is useful in a high speed (e.g., 250 KHz, 1 MHz) motor driver or a resonant or quasi-resonant DC-DC converter, and which is shown in FIG. 8, all of the elements included in the gate driver 102 of FIG. 5 (with the exception of the leakage inductance transformer 104) are implemented in the form of a monolithic silicon integrated circuit 200. In FIG. 8 the integrated circuit includes first diode D2, corresponding to first diode 110 in FIG. 5; second diode D4 and resistor R4, corresponding to the second diode 128 and resistor 130 which comprise the snubber circuit of FIG. 7; and a "triplington" arrangement of transistors Q6, Q15 and Q16 (hereinafter referred to as the "triplington"), corresponding to gate switch 112 of FIG. 5. The triplington can be seen to consist of a "darlington" arrangement of transistors Q15 and Q16 (hereinafter referred to as the "darlington") and a driver transistor, Q6. The balance of the circuit of FIG. 8 corresponds to the driver logic block 114 of FIG. 5. In application, the integrated circuit shown in FIG. 8 would, as shown in FIG. 9, be connected to a leakage inductance transformer 204 and a power switching device 218, via input, output and return connections 250, 252, and 254, respectively.

With reference to FIGS. 8, 9 and 10, the operation of the gate driver circuit 202 of FIG. 9 (incorporating the integrated circuit 200 of FIG. 8) can be explained by initially assuming that, just prior to the beginning of a switch cycle at time t=t0, the gate capacitance 216 of the power switching device 218 is discharged to a voltage of value Vi (the value of which is close to zero volts, as discussed below) and the power switching device is off. At time t=t0 the control circuitry 222 turns on the single-ended switch 224. As previously explained, closing the single ended switch initiates forward energy transfer from the bias voltage source 226 to the gate capacitance 216 via the leakage-inductance transformer 204 and the first diode D2. As Vsec and Vg begin to increase, transistors Q11, Q12, Q14 and Q27 are biased on via resistors R6, R7, R8 and diode D1. The effect of these devices being on is to: (a) hold the triplington transistors Q6, Q15 and Q16 off, thereby allowing the gate capacitance to continue to charge (FIG. 10C), and (b) hold transistors Q5, Q8, Q10 and Q19 off. The initial rise in gate voltage will also cause current to flow in resistor R14 and transistor Q18. Since transistors Q18 and Q4 are connected as a "current mirror", the current in the collector of Q4 would otherwise be essentially equal to the current which flows in R14, except that zener diode D11 will effectively prevent this flow of current until Vg exceeds the zener breakdown voltage (nominally 5.8 Volts in the actual circuit). Thus, until the Vg exceeds 5.8 Volts, transistor Q4 will be on, holding transistor Q13 off.

As Vg rises above 5.8 volts zener diode D11 will begin to conduct and, due to the fact that the collector current of Q4 is limited to a small value equal to that mirrored from Q18, the voltage at the collector of Q4 will start to rise. As the gate voltage rises above a predetermined minimum threshold value, $V_T$ (determined by the breakdown voltage of D11 and the values of resistors R16 and R26, and which, in the circuit of FIG. 8, is approximately 8 Volts), transistor Q13 will turn on (at time t1, FIG. 10E). Q13 holds the base of Q15 low thereby acting to disable the darlington.

At time t=t2 the secondary current, Isec (FIG. 10B) returns to zero and the gate voltage reaches a peak value Vmax', at which time the control circuitry 222 turns off the single-ended switch 224 and the secondary voltage, Vsec, collapses. Because the initial voltage across the gate capacitance was, at time t=t0, equal to Vi, the gate capacitance will, at time t=t2, have charged to a value Vmax'=Vmax−Vi (where Vmax=2·Vb·(k/a)), as earlier defined). The snubber formed of second diode 228 and resistor 230 dissipates the energy associated with any magnetizing current which is flowing in the transformer 204 at time t2. Collapse of the secondary voltage removes drive from transistors Q14 and Q27, causing them to turn off. As Q27 turns off, transistors Q8 and Q10 turn on as a result of current flow induced in resistor R13 via the gate voltage, Vg. Q8 being on "latches" Q27 off. Q10 being on causes both Q11 and Q12 to turn off. With Q11, Q12 and Q14 all being off, the darlington is held off solely as a result of Q13 being on.

Between t=t2 and t=t3 the gate voltage, Vg, will tend to decline somewhat due to the current drawn by the integrated circuit 200 and this will place an upper bound on the period of time that the power switching device 218 can remain in its on state. For the circuit of FIG. 8, resistor R5 will account for the bulk of this current, appearing as an effective resistance, Reff, of approximately 10 Kilohms across the gate capacitance. Between time t=t2 and t=t3 the time constant of the discharge can be estimated as $\tau$=Reff·Cg, where Cg is the effective value of the gate capacitance during the discharge. For example, if the power switching device 218 is a field effect transistor having an effective gate capacitance, Cg, of 3000 picofarads then the time constant of the discharge between time t=t2 and t=t3 will be approximately 30 microseconds. If the gate driver charges the gate to a peak voltage Vmax' (i.e., at time t2, FIG. 10C), and the minimum value of gate voltage needed to maintain the power switching device on is Vgmin volts, then the maximum on-time period will be, approximately, $t_{onmax}$=$\tau$ ln (Vmax'/Vgmin). For example, if Vmax'=13 volts and Vgmin=9 volts, then, for the conditions cited, $t_{onmax}$=11 microseconds. This is of concern primarily in low frequency switching power conversion applications in which the switch must be maintained on for periods comparable to $t_{onmax}$ (such as, for example, in a Pulse Width Modulated switching power converter operating at a switching frequency of 100 KHZ or less). For most resonant or zero-current switching converters, however, the on-time of the power switching device (or devices) is relatively fixed (e.g., 0.5 or 1 microsecond) even though the switching frequency may vary over a relatively wide range (e.g., from 50 KHz to 1 MHz). For example, the typical on-time of a power switching device in a production zero-current switching converter of the kind described in Vinciarelli, U.S. Pat. No. 4,415,959, at the time of filing of this application, was in the neighborhood of 500 nanoseconds. In such an application the effect on gate voltage of current drawn by the driver circuit of FIG. 8, during the on-time of the power switching device, would be negligible.

At time t3 the control circuitry 222 once again closes the single-ended switch 224. Since the first diode 210 is reverse biased, the voltage Vsec rises to a value Vmax/2, causing current to flow in resistor R3 and turning transistor Q6 on. Because the high current sourcing capability of Q6 exceeds the current sinking capability of transistor Q13, Q13 comes out of saturation, and Q15 and Q16 turn on. The rise in base voltage at Q16 turns Q19 on, which in turn turns Q13 off (FIG. 10E). The triplington (Q6, Q15, and Q16) is now on, and is being held on both by Vsec (via R3) and Vg (via R5). The gate capacitance is rapidly discharged, pulling both Vsec and Vg down (FIGS. 10C and 10D) and turning the power switching device off.

If there were no inductance in the connections between the integrated circuit 200 and the gate terminals of the power switching device, then as Vg declined to a voltage Vi, where Vi is between one and two diode drops (i.e., 0.6 to 1.4 volts), the integrated circuit would become essentially inactive and cease discharging the gate capacitance. In practical applications, however, there will be some amount of parasitic inductance in the leads of the power switching device and in the interconnections to the integrated circuit (as shown, for example, as the lumped parasitic inductances 501a, 501b in the interconnections between a generalized gate switch 112 and a power switching device 118, in FIG. 9B). During turn-on of the power switch these parasitic inductances are harmless, as they essentially form a portion of the total effective inductance through which energy is transferred to the gate capacitance. On turn-off, however, the parasitic inductances will cause the current and voltages associated with the discharge of the gate capacitance to attempt to oscillate between positive and negative values at a relatively high frequency. In the integrated circuit 200 of FIG. 8 the high speed output diode D6 will limit the peak negative excursion of, and rapidly damp, this oscillation, and the result of this clamping and damping will be that the value of Vi, in practical application, will end up close to zero volts.

It should also be noted that during the off-time of the power switching device the integrated circuit 200 will act to maintain a low impedance state across the gate terminals of the power switching device. Should the value of Vg attempt to rise above approximately two diode drops (e.g., 1.4 volts) current flow in R5 will activate the darlington and the gate voltage will be clamped. Most MOS power switching devices at the time of filing of this application have a threshold voltage rating (e.g., the value of gate voltage below which conduction in the power switching device effectively ceases) well above the latter value of voltage.

A potential problem associated with a multiplexed drive scheme is loss of pulse-by-pulse synchronization. For example, FIG. 11A shows a series of pulses being delivered to the input of a gate driver (e.g., as in FIG. 10A). Alternating pulses toggle the power switching device between its on and off states (FIG. 11B). In FIG. 11C, a series of gate driver input pulses is corrupted by a "noise" pulse at time t1, causing unintended turn-off of the power switching device (FIG. 11D). Starting at time t2, each subsequent input pulse would toggle the power switching device to a state which is the opposite of that which is desired. Such a loss of synchronism would generally cause catastrophic failure of a switching power conversion circuit.

The circuit 200 of FIG. 8 incorporates a mechanism which can be used to provide for automatic recovery from inadvertent loss of synchronization by allowing the circuit to distinguish between turn-on and turn-off pulses. In illustration of the operation of this mechanism we first note that charging of the gate capacitance to any particular voltage value requires that a certain corresponding amount of energy must be transferred from the bias voltage source (e.g., 226, FIG. 9) to the gate capacitance. The another way, to raise the voltage across the gate capacitance by some amount requires that a certain corresponding amount of charge must be transferred from the bias source to the gate capacitance. With reference to FIG. 8 and 9, one way to vary the amount of charge transferred to the gate capacitance during the on-time of the single-ended switch 224 is to change the amount of time that the switch is on. As the turn-on time of the single-ended switch (i.e., the time span between t=t0 and t=t2 (FIG. 10C)) is reduced, the amount of charge transferred to the gate capacitance will be reduced, as will the value of Vmax'. Below some value of turn-on time, the value of Vmax' will be less than $V_T$. Under these circumstances, Q13 (FIG. 8) will not turn on during the time interval t=t0 to t=t2 and, at time t2, when Vsec collapses and Q11 and Q12 turn off, the darlington will not be inhibited and will turn on (via Vg and R5), discharging Cg. Thus, if the turn-on time is reduced to be less than some appropriate level, a pulse delivered by the single-ended switch will not transfer sufficient charge to be able to latch the power switching device on. On the other hand, the amount of energy which must be transferred from the bias source 226 to the gate driver circuit 200 in order to turn the power switching device 218 off is much lower than the energy required to turn it on. Therefore, there is a value of single-ended switch turn-on time, $t_x$, which is sufficient to accomplish turn-off of the power switching device but which cannot transfer enough charge to latch the power switching device on. To turn the power switching device on, then, the control circuitry would deliver a "high energy" pulse by closing the single-ended switch and keeping it closed until the gate capacitance was fully charged (e.g., at essentially time t=t2, FIG. 10B, at which Isec crosses zero). To turn the power switch off the control circuitry would deliver a "low energy" pulse by closing the single-ended switch for a shorter fixed period of time, $t_x$.

That this provides a mechanism for automatic recovery from loss of synchronization is illustrated with reference to FIGS. 9, 11E and 11F. In FIG. 11E a series of high energy and low energy pulses are delivered to the gate driver circuitry 202. At times marked t=ton the control circuitry 222 indicates that the power switching device is to be turned on by delivering a high energy pulse; at times marked t=toff the control circuitry 222 indicates that the power switching device is to be turned off by delivering a low energy pulse. High energy turn-on pulses are indicated in FIG. 11E by the letter H; low energy turn-off pulses are indicated by the letter L. At time t1, a noise pulse appears (FIG. 11E), causing inadvertent turn-off of the switch. At time t2 a low-energy turn-off pulse is generated which cannot latch the power switching device into its on state. On the subsequent high-energy pulse, the power switching device turns on in synchronism with information delivered by the control circuitry.

Figure 12:
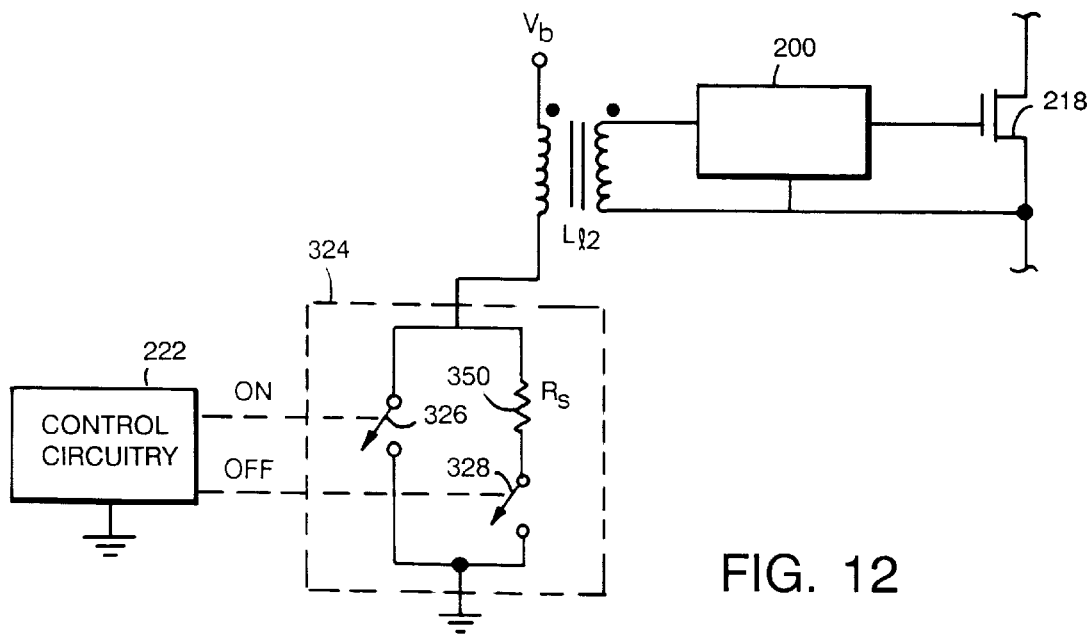
FIG. 12 shows a gate driver circuit which includes a dual-impedance single-ended driver.

Instead of adjusting the width of the pulse delivered by the single-ended switch, another way of adjusting the amount of energy (and charge) transferred by the single-ended switch is to add resistance in series with the switch. As this resistance is increased the amount of energy transferred to the gate capacitance within a fixed time period will be reduced, as will Vmax'. Above some resistance value, Vmax' will not exceed $V_T$ and the power switching device will not be latched on. FIG. 12 shows a schematic of a gate driver which includes a dual-resistance single-ended switch 324. When the power switching device 218 is to be turned on, a low-resistance switch 326 is closed and opened by the control circuitry 222; when the power switching device 218 is to be turned off, a high-resistance switch 328 (as indicated by the resistance, Rs 350, in series with the switch) is closed and opened by the control circuitry. When the low-resistance switch 326 is closed and opened a "high-energy" pulse is delivered to the gate driver circuitry 200; when the high-resistance switch 328 is closed and opened a "low-energy" pulse is delivered to the gate driver circuitry. A high-energy pulse can toggle the power switching device to either state (i.e., off-to-on and on-to-off), whereas a low-energy pulse, as explained above, can only toggle the power switching device from on to off. By delivering pulses whose energy levels correspond to whether the power switching device is to be on or off, the dual-resistance switch 324 of FIG. 12 can, if used in combination with gate-driver circuitry 200 of the kind shown in FIG. 8, provide automatic recovery from inadvertent loss of synchronization in a manner essentially the same as that which was previously described with reference to FIGS. 11E and 11F.

It should also be noted that, in the circuit 200 of FIG. 8, automatic discharge of Cg in response to Vg dropping below the threshold value $V_T$ is effective whenever the power switching device is on. For example, if a turn-on pulse transfers sufficient charge to raise Vg above $V_T$, but a subsequent turn-off pulse is not delivered prior to Vg declining below $V_T$ (e.g., due to R5 discharging Cg), then the circuit 200 will turn-on the darlington (as described above) and discharge Cg.

The sinusoidal variation in the waveforms of the transformer secondary current and the gate voltage, as illustrated, for example, in FIGS. 6B, 6D, 10B and 10C, assumes that the gate capacitance of the power switching device appears as a fixed, "lumped" value. In practice, the gate capacitance of a particular kind of power switching device may not be a fixed value, but might vary as a function of circuit parameters (e.g., voltages). Furthermore, variations in the voltage across, or the current carried by, the power switching device may influence the waveform of the gate voltage during turn-on and turn-off. For example, for a MOSFET: (a) the gate capacitance will vary as the square root of the gate voltage and, (b) as the gate voltage reaches the "threshold voltage" of the device, and the drain to source voltage starts to collapse, the gate voltage waveform will be distorted as current is drawn out of the gate via the gate-drain capacitance. The net effect will be that the variation in gate voltage on turn-on will not be a pure sinusoid, but will exhibit a certain degree of distortion. For any particular kind of power switching device having a capacitive gate control input the nature and degree of these distortions will differ. However, the presence of these distortions is simply indicative of the circuit characteristics of a particular kind of power switching device and is not in conflict with the basic operating principles embodied in the present invention.

A gate driver of the kind shown in FIG. 9, incorporating a monolithic integrated circuit implementation of the circuit of FIG. 8, was constructed and tested in the laboratory. The integrated circuit was manufactured using a bipolar process which was selected on the basis of the following combination of desirable attributes: (a) a high current, high speed, Schottky first diode (D2, FIG. 8) could be implemented directly on the die; (b) a high current "triplington" (Q6, Q15, Q16, FIG. 8), for rapidly discharging the gate capacitance, could also be implemented directly on the die; (c) the resulting die size was relatively small (45 mil square); and (d) the cost per die was low. When combined with a small leakage inductance transformer (204, FIG. 8) having 4 turns on its primary winding, 3 turns on its secondary winding, a total primary inductance of 7.6 microhenries, a total secondary inductance of 4.4 microhenries and a coupling coefficient of 0.96 (and an equivalent secondary leakage inductance of approximately 350 nanohenries); a type IRF 350 MOSFET power switching device (manufactured by International Rectifier, Ca., USA); and a bias voltage source (226, FIG. 8) of 12.5 volts, the driver exhibited a rise time of 230 nanoseconds (equivalent to time period t0 to t2 in FIG. 10), a fall time of 100 nanoseconds, and a peak value of gate voltage equal to 14 volts. The difference in the observed peak voltage of 14 volts, versus the predicted ideal peak voltage of approximately 18 volts, was a result of circuit voltage drops, and losses, in the nonideal components.

Figure 13:
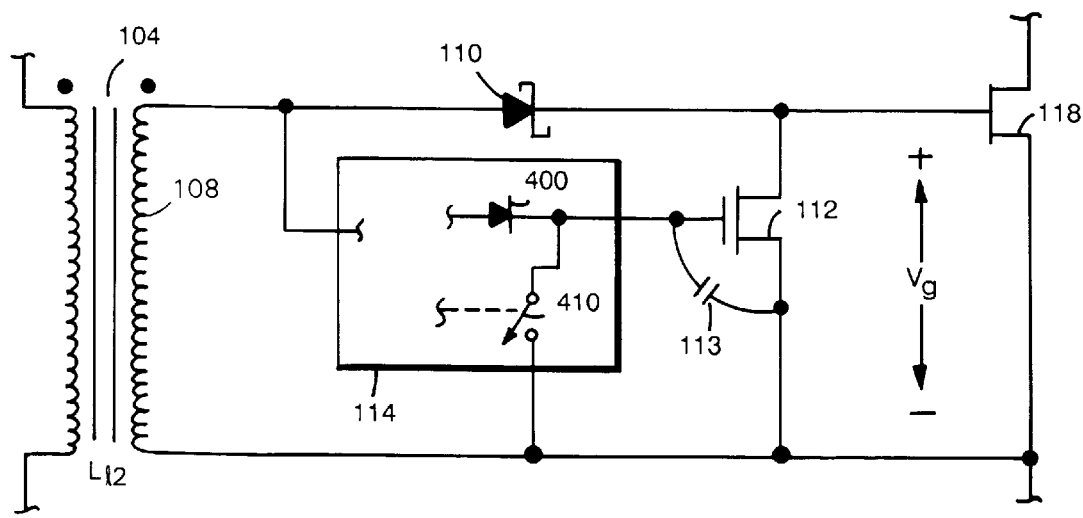
FIG. 13 shows one way of using a MOSFET as a gate switch in a gate driver circuit according to the present invention.

There are, of course, a great many ways of implementing a gate driver according to the present invention. Instead of using bipolar circuitry for the driver logic, CMOS circuitry could be used. This would decrease the power drawn by the driver logic during the on time of the switch and allow for longer allowable switch on-time. Instead of using a bipolar gate switch (e.g., the "triplington" of FIG. 8) a MOSFET, or other capacitive input, gate switch could be used. For example, FIG. 13 schematically shows a portion of one alternate embodiment of a gate driver circuit which incorporates a MOSFET gate switch 112. In the Figure, the first diode 110, the driver logic 114, the leakage inductance transformer secondary 108, the gate switch 112 and the power switching device 118 are connected as earlier shown in FIG. 5. However, in FIG. 13 the driver logic 114 turns on the gate switch by charging the gate capacitance 113 of the gate switch 112 via a diode 400. Once the gate capacitance of the gate switch 112 is charged, the gate switch turns on; the gate voltage, Vg, on the power switching device collapses; and the driver logic 114 becomes inactive. However, due to the presence of the diode 400, the gate capacitance 113 of the gate switch will remain charged, and the gate switch will present a low impedance across the gate terminals of the power switching device 118. To turn the power switching device on 118, the gate capacitance of the gate switch is discharged by the discharge switch 410 when a turn-on pulse is delivered to the driver logic via the leakage-inductance transformer 104.

In general, then, and with reference to FIG. 5, some of the operating features of a gate driver circuit 102 according to the present invention can be summarized as follows:

a.) The gate driver operates in a multiplexed mode: if a voltage pulse is applied across the primary winding 106 of the transformer 104 at a time when the power switching device 118 is off, the driver logic 114 will turn off the gate switch 112, thereby enabling charging of the effective gate capacitance 116 as a means of turning the power switching device on; if a voltage pulse is applied across the primary winding 106 of the transformer 104 at a time when the power switching device 118 is on, the driver logic will turn on the gate switch, thereby discharging the effective gate capacitance as a means of turning the power switching device off.

b.) The gate driver circuit effects charging of the effective gate capacitance 116 of the power switching device 118 by providing for quantized forward energy transfer between the bias voltage source 126 and the effective capacitance via the effective secondary leakage inductance of the leakage-inductance transformer 104.

c.) The driver logic 114 controls the opening and closing of the gate switch 112 based upon information regarding the conductivity of the power switching device 118 and the state of the single-ended switch 124 (i.e., opened or closed). If the power switching device is nonconductive at a time when the single-ended switch is closed the driver logic will open the gate switch, thereby enabling quantized forward energy transfer to take place between the bias voltage source and the effective capacitance as means of increasing the conductivity of the power switching device. If the power switching device is conductive at a time when the single-ended switch is closed, then the driver logic will close the gate switch as a means of turning the power switching device off. A preferred way for the driver logic to determine the conductivity of the power switching device is by measurement of the gate voltage, Vg. A preferred way for the driver logic to determine the state of the single-ended switch is by measurement of the transformer secondary voltage. There are, however, other ways to measure the conductivity of the power switching device. For example, the current flowing in the power switching device could be measured and compared to a predetermined threshold value. Such a measurement technique might be useful in nonzero-current switching power converters (e.g., PWM DC-DC converters) where opening and closing of the power switching device results in rapid, and relatively large, changes in the current carried by the device (such a technique would be less useful in a zero-current switching converter where the current in the power switching device starts and ends at zero current and rises and falls smoothly during an energy transfer phase).

d.) The control circuitry and single-ended switch can be arranged to selectively alter the amount of charge transferred to circuitry connected to the transformer secondary winding (e.g., the driver logic, the power switching device) during the period of time that the single-ended switch is on. In combination with appropriately designed driver logic, this feature can be used to provide a mechanism for allowing the driver logic to distinguish whether or not a charge transfer cycle (e.g., the closing and opening of the single-ended switch) is meant to turn on or turn off the power switching device.

With respect to controlling the single-ended switch (e.g., 124, FIG. 5; 224, FIG. 9; 324, FIG. 12) there are a wide variety of prior art techniques for turning the switch off at the end of the quantized energy transfer cycle (e.g., t=t0 to t=t1, FIG. 7; t=t0 to t=t2, FIG. 10). For example, an isolated current transformer could be used to sense secondary current, Isec, and, by means of low level comparator circuitry, turn the single-ended switch off (although the complexity of such a scheme would be uncalled for in most applications). Alternatively, primary current could be sensed (e.g., by using a current transformer, a resistor or some other active current sensing scheme) and the single-ended switch turned off when the current declined below a value corresponding to the anticipated value of primary magnetizing current at the end of the quantized energy transfer cycle. A much simpler technique would be to simply fix the on-time of the single-ended switch to a value greater than the anticipated maximum value of on-time required for the secondary winding current to reach zero-crossing (e.g., time t=t0 to t=t1 in FIG. 6B; t=t0 to t=t2 in FIG. 10B). While this would ensure that the current charging the gate capacitance (FIGS. 6B and 10B) would always reach zero-crossing, and that the gate voltage would always reach its maximum value, it would also lead to an increase in the amount of magnetizing current which would flow in the single-ended switch at the time the switch is turned off, along with an attendant increase in losses in the single-ended switch. However, because the amount of power processed by the single-ended switch is so low, the reduction in circuit complexity associated with implementing a fixed on-time approach would, in many applications, more than compensate for the essentially negligible loss in overall switching circuit efficiency associated with this increase in losses in the gate switch.

Figure 14:
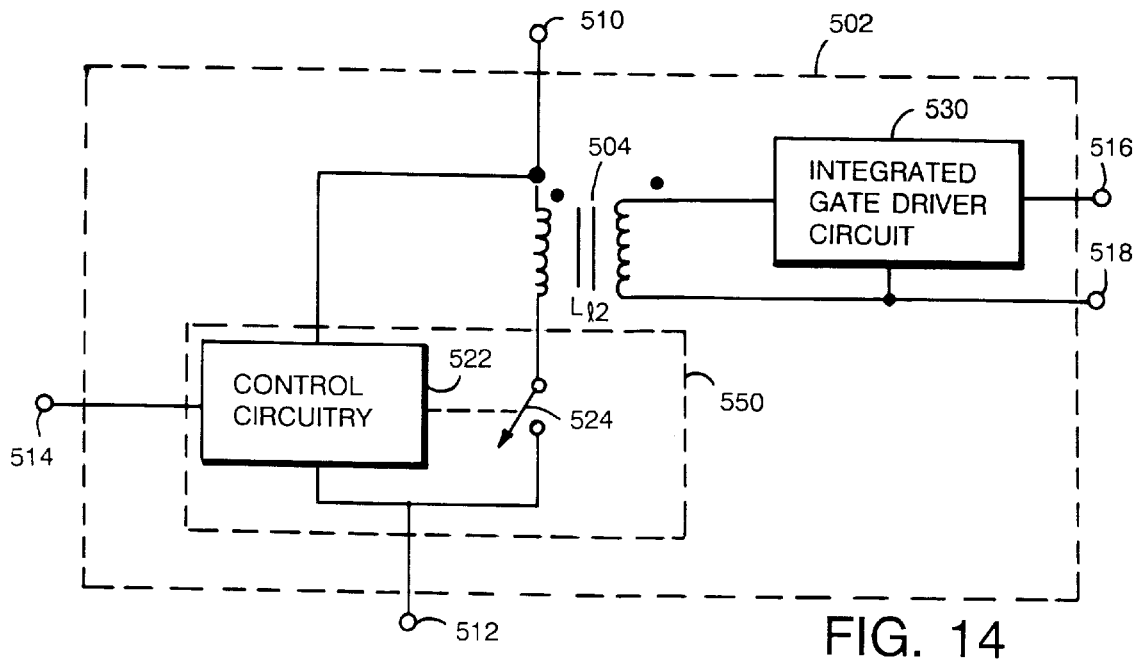
FIG. 14 shows a five-terminal device which incorporates various elements of the gate driver of FIG. 5 into a single package.
Figure 15:
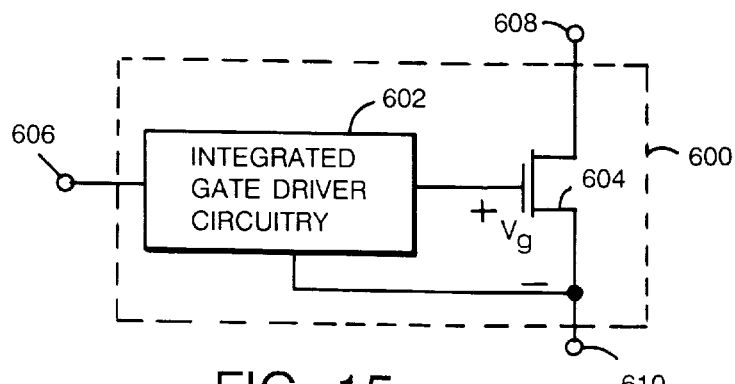
FIG. 15 shows a three-terminal device which combines elements of the gate driver of FIG. 5 along with a power switching device in a single package.

In another aspect, the present invention can be exploited to synthesize a variety of other useful devices. For example, FIG. 14 shows a block diagram of a five-terminal floating gate driver assembly which consolidates all of the essential elements of the floating gate driver of FIG. 5 (with the exception of the power switching device) into a single package (using, for example, hybrid packaging and interconnection techniques). In the Figure, the five-terminal floating gate driver assembly 502 consists of control circuitry 522; a single-ended switch 524; a leakage-inductance transformer 504, having a controlled amount of effective secondary leakage inductance Ll2; and an integrated gate driver circuit 530 (e.g., of the kind shown in FIG. 8). The five-terminal floating gate driver assembly 502 includes a bias voltage source terminal 510; an input terminal 514; a first signal return terminal 512; and a pair of gate connection terminals 516, 518 for connecting the assembly to a power switching device (not shown). Low level electrical information, indicative of whether the power switching device is to be on or off, is delivered to the input terminal 514. The first signal return terminal 512, which is the common signal return point for the bias voltage source (not shown), the control circuitry and the single-ended switch, is isolated from the gate connection terminals 516, 518 (and hence the power switching device) by the transformer. In preferred embodiments the control circuitry would be implemented as a monolithic integrated circuit, and would include the single-ended switch 524 (as indicated by the dashed line around the combination of the two elements 550). Another useful embodiment combines gate driver circuitry (e.g., as in FIG. 8) along with a power switching device in a single package. For example, FIG. 15 shows a three-terminal integrated-drive power switching device 600 comprising a power switching device (e.g., a MOSFET, an IGBT) 604 and gate driver circuitry 602 (e.g., of the kind shown in FIG. 8). A first terminal 606 is the input terminal for the gate driver circuitry; a second terminal 608 is both a first current-carrying termination for the power switching device and a reference point for both the electrical input delivered to the first terminal and the gate control input voltage, Vg; a third terminal 610 is a second current-carrying termination for the power switching device. In application, the integrated-drive power switching device of FIG. 15 would replace the separate integrated gate driver circuitry 200 and power switching device 218 of FIG. 9A. In a preferred embodiment, such a device would be constructed in a fully monolithic format: both the gate driver circuitry and the MOSFET would be combined on a single die. The benefits of this approach are reduction of overall size and cost, and minimization of parasitic inductances in the connections between the gate-driver circuitry and the MOSFET. In other embodiments the integrated-drive MOSFET could be constructed by combining a monolithic integrated gate driver circuit (e.g., as in FIG. 8) and a separate power switching device (i.e., in the form of a semiconductor die) into a single package using hybrid packaging and interconnection techniques.

Figure 16:
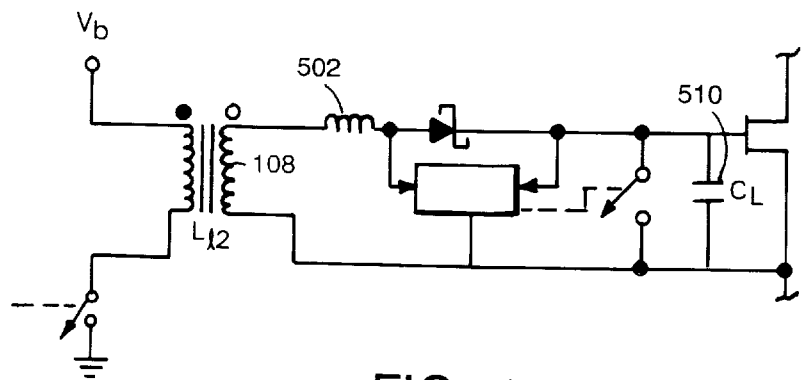
FIG. 16 shows one way of adding incremental inductance or capacitance in a gate driver circuit according to the present invention.

In other embodiments, a portion of the total effective circuit inductance might be incorporated as leakage inductance in the transformer, and a portion might be included as a lumped inductance in series with one or more of the transformer windings (e.g., the lumped inductor 502 shown connected in series with the secondary winding 108 of the leakage-inductance transformer in FIG. 16). Similarly, a portion of the total effective circuit capacitance might be included as a lumped capacitance across the gate terminals of the power switching device (i.e., lumped capacitor $C_L$ 510, also shown in FIG. 16).

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the claims.

What is claimed is:

1. Gate driver apparatus for charging and discharging a capacitive gate control input of a power switching device, the gate control input having an effective capacitance, the apparatus comprising a transformer including a primary winding and a secondary winding, the transformer having a preselected amount of effective leakage inductance;

a first switching device connected in series with said primary winding;

a first unidirectional conducting device connected in series with said secondary winding, said first unidirectional conducting device being oriented to conduct during conduction by said first switching device;

a port connected to pass energy conducted by the first unidirectional conducting device to the gate control input of the power switching device;

discharge circuitry connected to said port for selectively allowing or preventing discharging of the effective capacitance of the gate control input;

control circuitry for selectively closing and opening said first switching device to connect an input voltage source across said primary winding; and driver logic for enabling quantized forward energy transfer from said voltage source via the effective leakage inductance of the transformer to said gate control input such that the voltage across the effective capacitance of the gate control input is greater than a reflected source voltage established by said voltage source and said transformer, said driver logic enabling the quantized forward energy transfer by operating said discharge circuitry to selectively allow or prevent discharging of the effective capacitance.

2. The gate driver apparatus of claim 1 wherein said discharge circuitry comprises a second switching device connected in series with said first unidirectional conducting device and said secondary winding and connected to said port.

3. The gate driver apparatus of claim 2 wherein said driver logic comprises sensing circuitry for determining the on or off state of said power switching device and the open or closed state of said first switching device, and driver circuitry for enabling said quantized forward energy transfer and for operating said discharge circuitry, in response to said on or off state of said power switching device and said open or closed state of said first switching device.

4. The gate driver apparatus of claim 3 wherein said sensing circuitry comprises a first sense input connected to detect conductivity information indicative of whether said power switching device is turned on or turned off, and a second sense input connected to detect first-switch state information indicative of whether said first switching device is opened or closed, and said driver circuitry, in response to a closure of said first switching device at a time when said power switching device is off, causes said second switching device to open, thereby enabling quantized forward energy transfer from said voltage source to said effective capacitance of said gate control input as a means of turning said power switching device on, and, in response to a closure of said first switching device at a time when said power switching device is on, causes said second switching device to close, thereby discharging said effective capacitance and turning said power switching device off.

5. The apparatus of claim 1 wherein said control circuitry is arranged to open said first switching device at essentially the first instant in time following initiation of a quantized forward energy transfer cycle at which the current in said secondary winding returns to zero.

6. The apparatus of claim 1 wherein said control circuitry is arranged to open said first switching device at a point in time later than the time which is first instant in time following initiation of a quantized forward energy transfer cycle at which the current in said secondary winding returns to zero.

7. The apparatus of claim 1 wherein said control circuitry is arranged to open said first switching device after a predetermined time period following initiation of a quantized forward energy transfer cycle.

8. The apparatus of claim 7 wherein said predetermined period of time is selected to be greater than or equal to the maximum anticipated time span between closure of said first switch and the subsequent instant in time at which the current in said secondary winding returns to zero.

9. The apparatus of claim 4 wherein said conductivity information comprises an electrical signal indicative of the voltage across said gate control input.

10. The apparatus of claim 4 wherein said conductivity information comprises an electrical signal indicative of the current carried by said power switching device.

11. The apparatus of claim 1 wherein the state of said first switching device is determined by an electrical signal indicative of the voltage across said secondary winding.

12. The apparatus of claim 4 wherein said driver logic is arranged to turn said second switching device on when said conductivity information is below a predetermined first threshold value and said first switching device is open.

13. The apparatus of claim 12 wherein said conductivity information comprises the voltage at said gate control input and said first threshold value is essentially equal to 8 volts.

14. The apparatus of claim 1 further comprising means for controlling the effects of transformer magnetizing current.

15. The apparatus of claim 14 wherein said magnetizing current control means comprises a snubber circuit comprising a second unidirectional conducting device in series with a resistor, said snubber circuit being connected in parallel with said secondary winding, said second unidirectional conducting device being poled so that said second unidirectional conducting device is nonconducting when said first unidirectional conducting device is conducting current.

16. The apparatus of claim 15 wherein said first unidirectional conducting device, said second switch, said driver logic, and said snubber circuit comprise a single monolithic integrated circuit.

17. The apparatus of claim 1 further comprising a lumped inductance connected in series with said primary winding.

18. The apparatus of claim 1 further comprising a lumped inductance connected in series with said secondary winding.

19. The apparatus of claim 1 further comprising a lumped capacitance connected in parallel with said capacitive control input.

20. The apparatus of claim 1 wherein said first switching device and said control circuitry are arranged to selectively alter the amount of charge which can be delivered to circuitry connected to said secondary winding during a charge transfer cycle beginning with the closing of said first switching device and ending with the opening of said first switching device.

21. The apparatus of claim 20 wherein said first switching device and said control circuitry are arranged so that the amount of charge transferred during said charge transfer cycle will be below a first predetermined value if said charge transfer cycle is intended to cause said power switching device to turn off.

22. The apparatus of claim 21 wherein said driver logic is arranged so that if said power switching device is turned off at the beginning of said charge transfer cycle, and the amount of charge transferred during said charge transfer cycle is below said first predetermined value, then, at essentially the time at which said charge transfer cycle ends, said driver logic will cause said second switching device to close.

23. The apparatus of claim 20 wherein selective alteration of the amount of charge transferred during a charge transfer cycle is effected by altering the amount of time that said first switching device is closed.

24. The apparatus of claim 20 wherein said first switching device comprises a low-resistance switch in parallel with a high-resistance switch, and wherein selective alteration of the amount of charge transferred during a charge transfer cycle is effected by closing and opening one or the other of said switches.

25. The apparatus of claim 14 wherein said transformer, said first switching device, said control circuitry, said first unidirectional conducting device, said second switching device, said driver logic and said magnetizing current control means comprise a single composite device having at least the following five terminals, a first terminal for delivering electrical information to said control circuitry, said electrical information being indicative of whether said power switching device is to be turned on or turned off, a second terminal for connection to one end of said voltage source, a third terminal for connection to the signal return of said electrical information and to the other end of said voltage source, and fourth and fifth terminals for connection to said gate control input of said power switching device.

26. The apparatus of claim 25 wherein said control circuitry is embodied as a monolithic integrated circuit.

27. The apparatus of claim 25 wherein said control circuitry and said first switching device are embodied as a single monolithic integrated circuit.

28. The apparatus of claim 25 wherein said driver logic, said first unidirectional conducting device, said second switching device and said magnetizing current control means are embodied as a single monolithic integrated circuit.

29. The apparatus of claim 25 wherein said composite device comprises a hybrid construction.

30. Integrated drive power switching apparatus, for use with a bias voltage source, a transformer including a primary winding and a secondary winding, said transformer having a preselected amount of effective secondary leakage inductance, a first switching device connected in series with said primary winding, control circuitry for selectively closing and opening said first switching device, thereby connecting said bias voltage source across said primary winding, said integrated drive power switching apparatus comprising a power switching device having a capacitive gate control input, a first unidirectional conducting device connected in series with said secondary winding and said capacitive gate control input and oriented to conduct during conduction by said first switching device, a second switching device connected in parallel with said capacitive gate control input of said power switching device, magnetizing current control means connected in parallel with said secondary winding, and driver logic for opening and closing said second switching device, said driver logic having a first sense input and a second sense input, said first sense input accepting conductivity information indicative of whether said power switching device is turned on or turned off, said second sense input accepting first switch state information, indicative of whether said first switching device is opened or closed, wherein, in response to a closure of said first switching device at a time when said power switching device is off, said driver logic is arranged to cause said second switching device to open, thereby enabling quantized forward energy transfer between said bias source and the effective capacitance of said gate control input as a means of turning said power switching device on, and wherein, in response to a closure of said first switching device at a time when said power switching device is on, said driver logic is arranged to cause said second switching device to close, thereby discharging said effective capacitance and turning said power switching device off; and wherein as a result of said quantized forward energy transfer the voltage across the effective capacitance of said gate control input is greater than a reflected source voltage established by said bias source and said transformer.

31. The apparatus of claim 30 wherein said integrated drive power switching apparatus is embodied as a monolithic integrated circuit on a single die.

32. The apparatus of claim 30 wherein said integrated drive power switching device comprises a first monolithic integrated circuit comprising
said first unidirectional conducting device;
said second switching device;
said magnetizing current control means;
said driver logic; and a power semiconductor die embodying said power switching device, said first monolithic integrated circuit and said semiconductor die being combined into a single package by means of hybrid construction and interconnection techniques.

33. A method of controlling a power switching device having a capacitive gate control input, comprising:

providing a transformer having a preselected amount of leakage inductance;

providing a unidirectional conducting device connected between a secondary winding of the transformer and the capacitive gate control input;

turning on the power switching device by closing and opening a first switching device to connect a voltage source to a primary winding of the transformer to cause selective quantized forward energy transfer from the voltage source to charge the capacitive gate control input to a voltage greater than a reflected source voltage established by the voltage source and the transformer; and turning off the power switching device by discharging the capacitive gate control input in response to the opened or closed state of the first switching device.

34. The method of claim 33 further comprising detecting conductivity information indicative of whether said power switching device is turned on or turned off.

35. The method of claim 33 further comprising, in response to a closure of said first switching device at a time when said power switching device is off, causing a second switching device to open, thereby enabling quantized forward energy transfer from said source to said effective capacitance of said gate control input as a means of turning said power switching device on, and, in response to a closure of said first switching device at a time when said power switching device is on, causing said second switching device to close, thereby discharging said effective capacitance and turning said power switching device off.

36. The method of claim 33 comprising delivering a succession of unidirectional voltage pulses to said primary winding of said transformer, each consecutive one of said unidirectional pulses causing said power switching device to alternately turn on and turn off.

37. The method of claim 36 further comprising the step of avoiding loss of pulse-by-pulse synchronization by selectively altering an amount of charge transferred to circuitry connected to said secondary winding during the period that said first switching device is closed depending on whether closure of said first switch is intended to turn said power switching device on or off, and discharging the effective capacitance of the gate control input of said power switching device if the charge delivered to said effective capacitance during the time period during which said first switching device is closed is below a predetermined threshold value.

38. A method of controlling a power switching device as claimed in claim 33, wherein the power switching device remains on after the first switching device is opened.

39. A method of controlling a power switching device as claimed in claim 33, wherein the capacitive gate control input is discharged in response to the on or off state of the power switching device.

* * * * *